United States Patent
An et al.

(10) Patent No.: US 7,767,568 B2
(45) Date of Patent: Aug. 3, 2010

(54) PHASE CHANGE MEMORY DEVICE AND METHOD OF FABRICATING THE SAME

(75) Inventors: Hyeong-Geun An, Hwaseong-si (KR); Hideki Horii, Seoul (KR); Jong-Chan Shin, Seongnam-si (KR); Dong-Ho Ahn, Suwon-si (KR); Jun-Soo Bae, Hwaseong-si (KR); Jeong-Hee Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 35 days.

(21) Appl. No.: 11/905,244

(22) Filed: Sep. 28, 2007

(65) Prior Publication Data

US 2008/0237566 A1 Oct. 2, 2008

(30) Foreign Application Priority Data

Mar. 26, 2007 (KR) .................... 10-2007-0029280

(51) Int. Cl.
*H01L 21/3205* (2006.01)
(52) U.S. Cl. .............................. 438/588; 257/4; 257/5; 257/E31.029; 365/148; 438/578; 438/605; 438/666
(58) Field of Classification Search .................... None
See application file for complete search history.

(56) References Cited

U.S. PATENT DOCUMENTS

| | | | |
|---|---|---|---|
| 6,625,054 B2 | 9/2003 | Lowrey et al. | |
| 6,687,153 B2 | 2/2004 | Lowrey | |
| 6,927,410 B2 | 8/2005 | Chen | |
| 7,012,273 B2 | 3/2006 | Chen | |
| 7,052,941 B2 | 5/2006 | Lee | |
| 7,141,481 B2 | 11/2006 | Hsu et al. | |

(Continued)

FOREIGN PATENT DOCUMENTS

JP 2006-179778 7/2006

(Continued)

OTHER PUBLICATIONS

Office Action dated Mar. 13, 2008 for related Korean Application No. 10-2007-0034246.

(Continued)

*Primary Examiner*—Evan Pert
*Assistant Examiner*—Scott R Wilson
(74) *Attorney, Agent, or Firm*—Harness, Dickey & Pierce, P.L.C.

(57) ABSTRACT

A phase change memory device and method of manufacturing the same is provided. A first electrode having a first surface is provided on a substrate. A second electrode having a second surface at a different level from the first surface is on the substrate. The second electrode may be spaced apart from the first electrode. A third electrode may be formed corresponding to the first electrode. A fourth electrode may be formed corresponding to the second electrode. A first phase change pattern may be interposed between the first surface and the third electrode. A second phase change pattern may be interposed between the second surface and the fourth electrode. Upper surfaces of the first and second phase change patterns may be on the same plane.

11 Claims, 12 Drawing Sheets

U.S. PATENT DOCUMENTS

| | | | |
|---|---|---|---|
| 7,335,906 B2 | 2/2008 | Toda | |
| 7,488,968 B2 | 2/2009 | Lee | |
| 7,576,350 B2 | 8/2009 | Lowrey et al. | |
| 2003/0047727 A1* | 3/2003 | Chiang | 257/3 |
| 2004/0178404 A1 | 9/2004 | Ovshinsky | |
| 2005/0003602 A1 | 1/2005 | Lowrrey et al. | |
| 2005/0009286 A1 | 1/2005 | Hsu et al. | |
| 2005/0015354 A1 | 1/2005 | Grubbs et al. | |
| 2005/0051901 A1 | 3/2005 | Chen | |
| 2005/0112896 A1 | 5/2005 | Hamann et al. | |
| 2005/0247922 A1* | 11/2005 | Oh et al. | 257/4 |
| 2006/0077741 A1 | 4/2006 | Wang et al. | |
| 2006/0226411 A1 | 10/2006 | Lee | |
| 2007/0047296 A1 | 3/2007 | Philipp et al. | |
| 2007/0097739 A1 | 5/2007 | Happ et al. | |
| 2007/0153570 A1 | 7/2007 | Suh et al. | |
| 2007/0249083 A1* | 10/2007 | Li et al. | 438/54 |
| 2008/0017894 A1 | 1/2008 | Happ et al. | |
| 2008/0019257 A1 | 1/2008 | Philipp et al. | |
| 2008/0025081 A1 | 1/2008 | Cho et al. | |
| 2008/0248632 A1 | 10/2008 | Youn et al. | |
| 2009/0026439 A1* | 1/2009 | Park et al. | 257/4 |

FOREIGN PATENT DOCUMENTS

| | | |
|---|---|---|
| JP | 2006-222215 | 8/2006 |
| KR | 1020030087426 A | 11/2003 |
| KR | 10-2005-0087154 | 8/2005 |
| KR | 1020060001054 A | 1/2006 |

OTHER PUBLICATIONS

Decision of Grant dated Feb. 4, 2008 for corresponding Korean Application No. 10-2007-0029280.

Office Action of co-pending U.S. Appl. No. 12/062,905 dated Jul. 17, 2009.

* cited by examiner

PHASE CHANGE MEMORY DEVICE AND METHOD OF FABRICATING THE SAME

PRIORITY STATEMENT

This application claims the benefit of priority under 35 U.S.C. §119 from Korean Patent Application No. 10-2007-0029280, filed Mar. 26, 2007, the contents of which are hereby incorporated herein by reference in their entirety.

BACKGROUND

1. Field

Example embodiments relate to a semiconductor memory device and a method of fabricating the same. Other example embodiments relate to a phase change memory device and a method of fabricating the same.

2. Description of the Related Art

Semiconductor memory devices may be classified as volatile memory devices or non-volatile memory devices. Non-volatile memory devices maintain data stored when power is turned off. Non-volatile memory devices are widely used in mobile telecommunication systems, mobile memory devices, auxiliary memories of a digital device and the like.

Extensive research has been performed on memory devices with structures that have non-volatile memory characteristics and increased integration density. This research has lead to the development of a phase change memory device. A unit cell of the phase change memory device may include an access device and a data storage element serially connected to the access device. The data storage element includes a lower electrode electrically connected to the access device and a phase change material layer in contact with the lower electrode. The phase change material layer may be a material layer that electrically switches between an amorphous state and a crystalline state. The phase change material layer may be a material layer that electrically switches between various resistivity states under the crystalline state conditions depending on the provided current.

FIG. 1 is a diagram illustrating a cross-sectional view of a conventional phase change memory device.

Referring to FIG. 1, the conventional phase change memory device includes a lower insulating layer 12 disposed (or positioned) on a desired region of a semiconductor substrate 11. A word line 13 may be disposed (or positioned) on the lower insulating layer 12. An upper insulating layer 15 may cover (or be formed over) the semiconductor substrate 11 having the word line 13. The first and second lower electrodes 17A and 17B may be disposed (or positioned) in the upper insulating-layer 15 and in contact with the word line 13. First and second phase change patterns 18A and 18B may be in contact with the first and second lower electrodes 17A and 17B, respectively. First and second upper electrodes 19A and 19B may disposed (or positioned) on the upper insulating layer 15 and in contact with the first and second phase change patterns 18A and 18B, respectively. The first phase change pattern 18A may be interposed between the first lower electrode 17A and the first upper electrode 19A. The second phase change pattern 18B may be interposed between the second lower electrode 17B and the second upper electrode 19B: The first phase change pattern 18A may be separated from the second phase change pattern 18B.

If a program current flows through the first lower electrode 17A, Joule heat is generated at an interface between the first lower electrode 17A and the first phase change pattern 18A. The Joule heat converts a first transition volume 20A that is a part of the first phase change pattern 18A into an amorphous or crystalline state. Resistivity of the first transition volume 20A in the amorphous state may be higher than that of the first transition volume 20A in the crystalline state. Whether information stored in a unit cell of the phase change memory device is a logic "1" or a logic "0" may be determined by sensing (or detecting) the current that flows through the first transition volume 20A in a read mode. If a program current flows through the second lower electrode 17B, a second transition volume 20B that is a part of the second phase change pattern 18B may be converted into an amorphous or crystalline state.

The smaller the gap between the phase change patterns 18A and 18B, the higher the integration intensity of the phase change memory device. Upper surfaces of the lower electrodes 17A and 17B may be disposed (or formed) at substantially the same level. The phase change patterns 18A and 18B may be spaced apart from each other by a first distance D1. The transition volumes 20A and 20B may be spaced apart from each other by the first distance D1.

The heat generated at an interface between the first lower electrode 17A and the first phase change pattern 18A may be transferred to the second phase change pattern 18B through the upper insulating layer 15. The second transition volume 20B may be converted into an amorphous or crystalline state. The first transition volume 20A may be converted into an amorphous or crystalline state by heat generated at an interface between the second lower electrode 17B and the second phase change pattern 18B. The phase change patterns 18A and 18B may interfere with each other, causing malfunction. There is a limit to reducing the distance between the phase change patterns 18A and 18B.

SUMMARY

Example embodiments relate to a semiconductor memory device and a method of fabricating the same. Other example embodiments relate to a phase change memory device and a method of fabricating the same.

Example embodiments provide a phase change memory device capable of decreasing thermal interference effects between phase change patterns adjacent to each other.

The phase change memory device includes a first electrode disposed (or formed) on a substrate and having a first surface. A second electrode having a second surface disposed (or formed) at a different level from the first surface is provided. The second electrode may be spaced apart from the first electrode. A first phase change pattern is in contact with the first surface. A second phase change pattern is in contact with the second surface.

According to example embodiments, an interlayer insulating layer having first and second contact holes may be disposed (or formed) on the substrate. The first surface and the first phase change pattern may be disposed (or formed) in the first contact hole. The second surface and the second phase change pattern may be disposed (or formed) in the second contact hole. Spacers may be interposed between: the phase change patterns and the interlayer insulating layer.

According to example embodiments, the second surface may be disposed (or formed) at a higher level than the first surface.

In other example embodiments, upper surfaces of the first and second phase change patterns may be disposed (or formed) at the same plane.

In yet other example embodiments, word lines electrically connected to the first and second electrodes may be provided. A bit line may be electrically connected to the first and second phase change patterns. A third electrode may be interposed between the first phase change pattern and the bit line. A fourth electrode may be interposed between the second phase change pattern and the bit line.

In yet other example embodiments, the first and second electrode may be one selected from the group consisting of a Ti layer, a TiSi layer, a TiN layer, a TiON layer, a TiW layer, a TiAlN layer, a TiAlON layer, a TiSiN layer, a TiBN layer, a W layer, a WN layer, a WON layer, a WSiN layer, a WBN layer, a WCN layer, a Si layer, a Ta layer, a TaSi layer, a TaN layer, a TaON layer, a TaAlN layer, a TaSiN layer, a TaCN layer, a Mo layer, a MoN layer, a MoSiN layer, a MoAlN layer, a NbN layer, a ZrSiN layer, a ZrAlN layer, a conductive carbon group, a Cu layer or combinations thereof.

In yet other example embodiments, the first and second phase change patterns may be two or more compounds selected from the group consisting of Te, Se, Ge, Sb, Bi, Pb, Sn, Ag, As, S, Si, P, O, C or combinations thereof.

In yet other example embodiments, a distance between the first and second surfaces may be greater than a distance between the first surface and the second electrode.

Example embodiments are also directed to a method of fabricating a phase change memory device. The method includes forming first and second electrodes on a substrate. The first and second electrodes may be spaced apart from each other. The first electrode has a first surface. The second electrode has a second surface disposed (or formed) at a different level from the first surface. A first phase change pattern may be formed on the first electrode. A second phase change pattern may be formed on the second electrode. The first phase change pattern may be in contact with the first surface. The second phase change pattern may be in contact with the second surface.

According to example embodiments, an interlayer insulating layer may be formed on the substrate, before forming the first and second electrodes. First and second contact holes may be formed passing through the interlayer insulating layer. The first surface and the first phase change pattern may be formed in the first contact hole. The second surface and the second phase change pattern may be formed in the second contact hole. The second surface may be formed at a higher level than the first surface. Upper surfaces of the first and second phase change patterns be formed on the same plane.

In other example embodiments, spacers may be formed on sidewalls of the first and second contact holes.

In yet other example embodiments, forming the first and second phase change patterns may include filling the first and second contact holes, forming a change material layer covering (or over) the substrate and planarizing the phase change material layer to expose the interlayer insulating layer.

In yet other example embodiments, forming the first and second electrodes may include forming a lower electrode layer that fills the first and second contact holes and covers the substrate. A first preliminary electrode filling the first contact hole and a second preliminary electrode filling the second contact hole may be formed by planarizing the lower electrode layer. A sacrificial electrode may be formed on the second preliminary electrode. The sacrificial electrode may be formed of the same material as the second preliminary electrode. An etch-back technique may be performed on the first preliminary electrode, the sacrificial electrode and the second preliminary electrode.

In yet other example embodiments, forming the first and second electrodes may include forming a lower electrode layer that fills the first and second contact holes and covers the substrate. The lower electrode layer may be planarized to form a first preliminary electrode filling the first contact hole and a second preliminary electrode filling the second contact hole. A sacrificial pattern may be formed on the second preliminary electrode. The sacrificial pattern may be a photoresist pattern or a hard mask pattern. The first preliminary electrode may be etched using the sacrificial pattern as an etch mask to form a recessed preliminary electrode. The sacrificial pattern may be removed. An etch-back technique may be used on the recessed preliminary electrode and the second preliminary electrode.

In yet other example embodiments, forming the first and second electrodes may include forming a lower electrode layer that fills the first and second contact holes and covers the substrate. The lower electrode layer may be patterned to form a recessed preliminary electrode in the first contact hole and remain the same patterned lower electrode layer in the second contact hole. The recessed preliminary electrode may be formed at a lower level than the upper surface of the patterned lower electrode layer. An etch-back technique may be used on the recessed preliminary electrode and the patterned lower electrode layer.

In yet other example embodiments, patterning the lower electrode layer may include forming a mask pattern covering the second contact hole and exposing an upper portion of the first contact hole on the lower electrode layer. The exposed lower electrode layer may be etched-back.

In yet other example embodiments, word lines electrically connected to the first and second electrodes may be formed on the substrate. A bit line may be electrically connected to third and fourth electrodes.

A bit line may be electrically connected to the first and second phase change patterns. A third electrode may be formed between the first phase change pattern and the bit line. A fourth electrode may be formed between the second phase change pattern and the bit line.

BRIEF DESCRIPTION OF THE DRAWINGS

Example embodiments will be more clearly understood from the following detailed description taken in conjunction with the accompanying drawings.

FIG. 1 is a diagram illustrating a partial cross-sectional view of a conventional phase change memory device;

FIG. 2 is an equivalent circuit diagram illustrating a portion of a cell array region of a phase change memory device according to example embodiments;

FIG. 3 is a diagram illustrating a top view of a portion of a cell array region of a phase change memory device according to example embodiments;

FIG. 4 is a diagram illustrating across-sectional view taken along line I-I' of FIG. 3 of the phase change memory device according to example embodiments;

FIG. 5 is a diagram illustrating a cross-sectional view of a phase change memory device where a variation is made according to example embodiments;

FIG. 6 is an equivalent circuit diagram illustrating a portion of a cell array region of a phase change memory device according to example embodiments;

FIG. 7 is a diagram illustrating a cross-sectional view of a portion of a cell array region of a phase change memory device according to example embodiments;

FIG. 8 is an equivalent circuit diagram Illustrating a portion of a cell array region of a phase change memory device according example embodiments;

FIG. 9 is a diagram illustrating a cross-sectional view of a portion of a cell array region of the phase change memory device according to example embodiments;

FIGS. 10 to 17 are diagrams illustrating cross-sectional views taken along line I-I' of FIG. 3 of a method of fabricating the phase change memory device according to example embodiments;

FIGS. 18 to 20 are diagrams illustrating cross-sectional views taken along line I-I' of FIG. 3 of another method of fabricating the phase change memory device according to example embodiments; and FIGS. 21 and 22 are diagrams illustrating cross-sectional views taken along device according to example embodiments.

DETAILED DESCRIPTION

Figure 1:
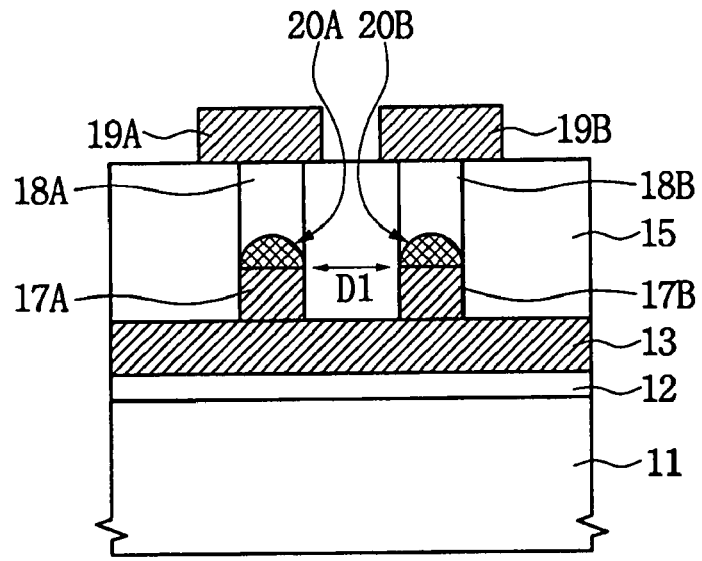
FIGS. 1-22 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular Embodiments only and is not intended to be limiting of example embodiments. As used herein, the singular forms "a," "an" and "the" are intended to include the plural forms as well, unless the context clearly Indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, to figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to a semiconductor memory device and a method of fabricating the same. Other example embodiments relate to a phase change memory device and a method of fabricating the same.

Figure 2:
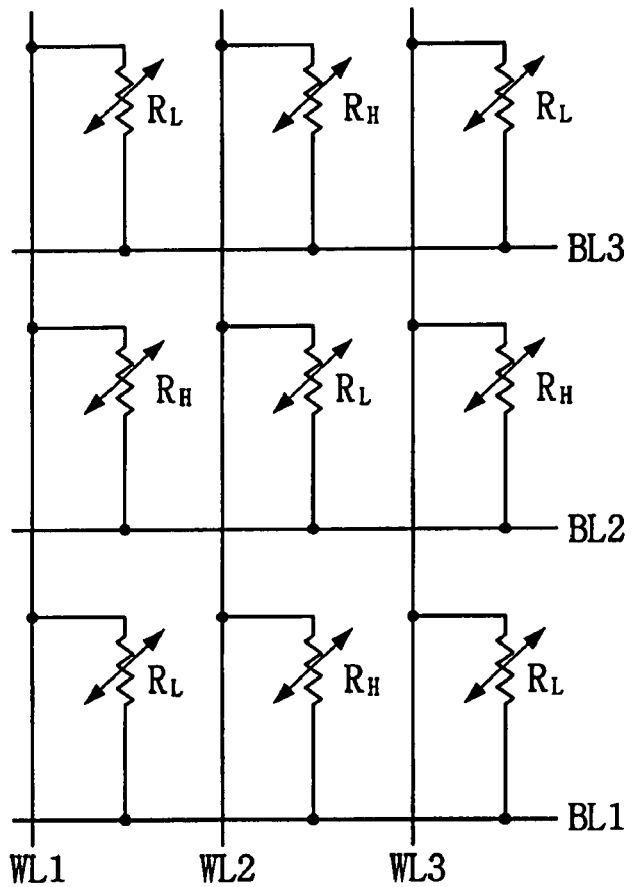

FIG. 2 is an equivalent circuit diagram of a portion of a cell array region of a phase change memory device according to example embodiments.

Referring to FIG. 2, the phase change memory device may include first word line WL1, second word line WL2, third word line WL3, first bit line BL1, second bit line BL2, third bit line BL3 and a plurality of phase change patterns $R_L$ and $R_H$. The first word line WL1, second word line WL2, and third word line WL3 may be disposed (or formed) parallel to one another in a column (or vertical) direction. First bit line BL1, second bit line BL2 and third bit line BL3 may be disposed (or formed) parallel to one another in a row (or horizontal) direction. The phase change patterns $R_L$ and $R_H$ may include a first transition volume or a second transition volume.

The transition volumes may be disposed (or formed) at different levels. The second transition volume may be disposed (or formed) at a higher level than the first transition volume. The phase change patterns $R_L$ and $R_H$ may be divided into low phase change patterns $R_L$ having the first transition volume and high phase change patterns $R_H$ having the second transition volume.

The bit lines BL1, BL2 and BL3 may cross the word lines WL1, WL2 and WL3. The phase change patterns $R_L$ and $R_H$ may be disposed (or formed) at intersections of the bit lines BL1, BL2 and BL3 and the word lines WL1, WL2 and WL3. For example, the low phase change pattern $R_L$ may be formed at an intersection of the first bit line BL1 and the first word line WL1. The high phase change pattern $R_H$ may be formed at an intersection of the first bit line BL1 and the second word line WL2. The low phase change pattern $R_L$ may be formed at an intersection of the first bit line BL1 and the third word line WL3.

The high phase change pattern $R_H$ may be disposed (or formed) at an intersection of the second bit line BL2 and the first word line WL1. The low phase change pattern $R_L$ may be disposed (or formed) at an intersection of the second bit line BL2 and the second word line WL2. The high phase change pattern $R_H$ may be disposed (or formed) at an intersection of the second bit line BL2 and the third word line WL3.

The low phase change pattern $R_L$ may be disposed (or formed) at an intersection of the third bit line BL3 and the first word line WL1. The high phase change pattern $R_H$ may be disposed (or formed) at an intersection of the third bit line BL3 and the second word line WL2. The low phase change pattern $R_L$ may be disposed (or formed) at an intersection of the third bit line BL3 and the third word line WL3.

Figure 3:
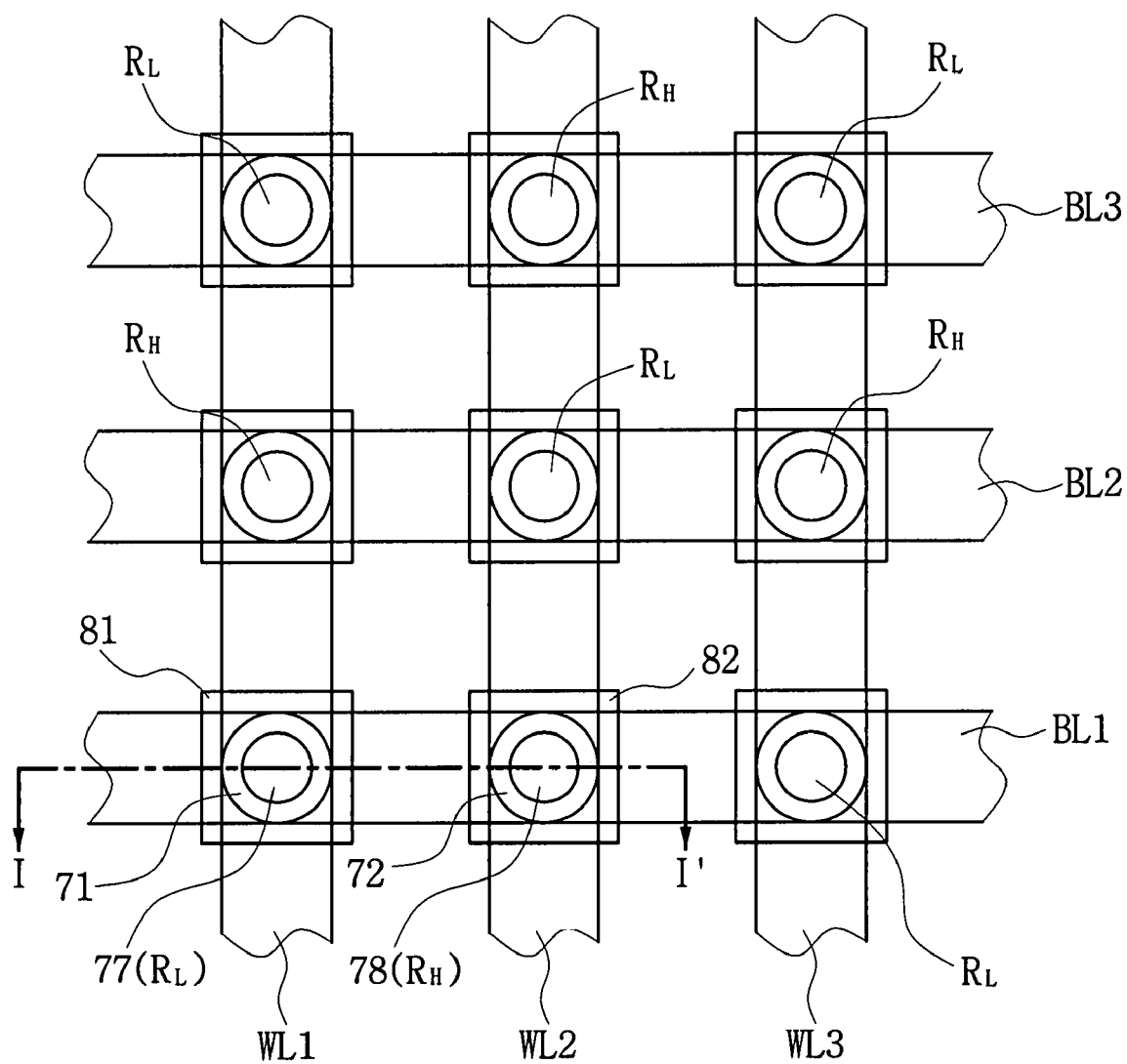

FIG. 3 is a diagram illustrating a top view of a portion of a cell array region of a phase change memory device according to example embodiments. For example, FIG. 3 may be a top view of a portion of the cell array region of FIG. 2.

Figure 4:
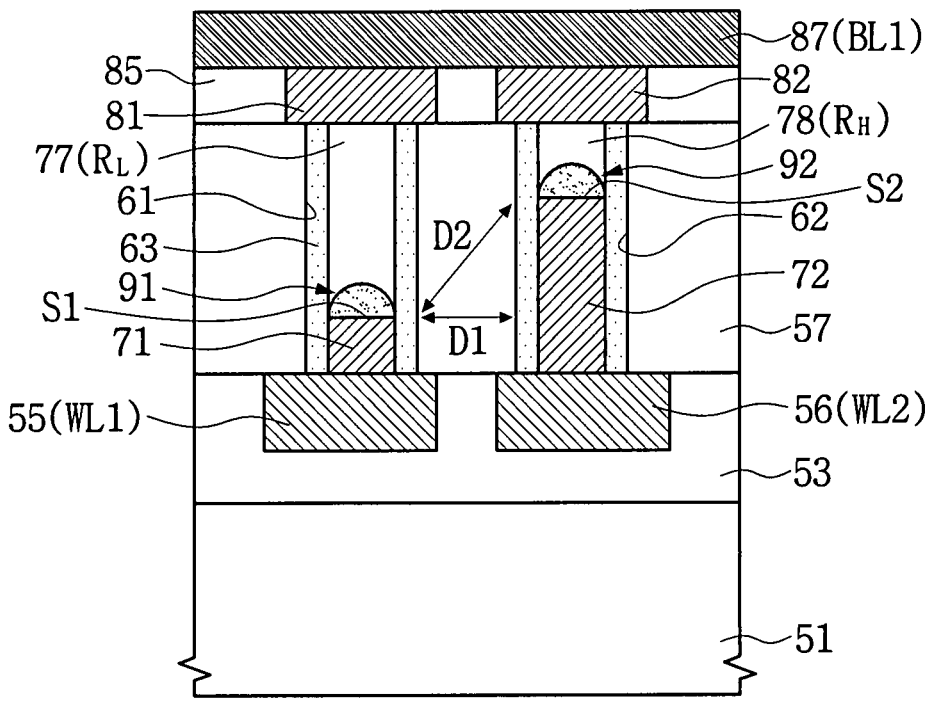

FIG. 4 is a diagram illustrating a cross-sectional view taken along line I-I' of FIG. 3 of a phase change memory device according to example embodiments.

Referring to FIGS. 3 and 4, the phase change memory device according to example embodiments may include word line WL1 55, word line WL2 56, word line WL3, bit line BL1 87, bit line BL2 and bit line BL3 provided on a substrate 51. The substrate 51 may be a semiconductor substrate (e.g., a silicon wafer).

A lower insulating layer 53 may be provided on the substrate 51. The lower insulating layer 53 may be an insulating layer (e.g., a silicon oxide layer, a silicon nitride layer, a silicon oxynitride layer or a combination thereof. First word line WL1 55 and second word line WL2 56 may be disposed (or formed) parallel to each other in the lower insulating layer 53. An upper surface of the lower insulating layer 53 and upper surfaces of the first word line WL1 55 and second word lines WL2 56 may be exposed on the same plane. The first word line WL1 55 and second word line WL2 56 may be a conductive pattern (e.g., a polysilicon pattern, an interconnection or an epitaxial semiconductor pattern).

An interlayer insulating layer 57 may be provided on the word line WL1 55, the word line WL2 56 and the lower insulating layer 53. The interlayer insulating layer 57 may be an insulating layer (e.g., a silicon oxide layer, a silicon nitride layer, a silicon oxynitride layer or a combination thereof. The interlayer insulating layer 57 may have a planarized upper surface.

First contact hole 61 and second contact hole 62 passing through the interlayer insulating layer 57 may be disposed (or formed) on the word line WL1 55 and the word line WL2 56. The first contact hole 61 and the second contact hole 62 may be spaced apart from each other by a first distance D1. First electrode 71 and second electrode 72 may be disposed (or formed) in the contact holes 61 and 62, respectively. The first and second electrodes 71 and 72 may be in contact with the first word line WL1 55 and the second word line WL2 56, respectively. The first and second electrodes 71 and 72 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

Each of the first and second electrodes 71 and 72 will be referred to as a first lower electrode 71 and a second lower electrode 72 below for the sake of clarity.

The first lower electrode 71 may include a first surface S1. The first lower electrode 71 may be formed in the first contact hole 61. The second lower electrode 72 may include a second surface S2. The second lower electrode 72 may be formed in the second contact hole 62. The first and second surfaces S1 and S2 may be disposed (or formed) at different levels from each other. The second surface S2 may be disposed (or formed) at a higher level than the first surface S1;

A first phase change pattern $R_L$ 77 filling the first contact hole 61 may be provided on the first lower electrode 71. A second phase change pattern $R_H$ 78 filling the second contact hole 62 may be provided on the second lower electrode 72. The first phase change pattern $R_L$ 77 may be in contact with the first surface S1. The second phase change pattern $R_H$ 78 may be in contact with the second surface The first phase change pattern $R_L$ 77 may be formed of two or more compounds selected from the group consisting of Te, Se, Ge, Sb, Bi, Pb, Sn, Ag, As, S, Si, P, O, C and combinations thereof. The second phase change pattern $R_H$ 78 may be formed of two or more compounds selected from the group consisting of Te, Se, Ge, Sb, Bi, Pb, Sn, Ag, As, S, Si, P, O, C and combinations thereof.

Upper surfaces of the first phase change pattern $R_L$ 77 and the second phase change pattern $R_H$ 78 may be exposed on the same plane. The interlayer insulating layer 57, the first phase change pattern $R_L$ 77, and the second phase change pattern $R_H$ 78 may be exposed on the same plane.

The third and fourth electrodes 81 and 82 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

The third and fourth electrodes 81 and 82 will be respectively referred to as a first upper electrode 81 and a second upper electrode 82 for clarity.

The first upper electrode 81 may be in contact with the first phase change pattern $R_L$ 77. The second upper electrode 82 may be in contact with the second phase change pattern $R_H$ 78. The first upper electrode 81 may be electrically c6hnected to the first word line 55 through the first phase change pattern $R_L$ 77 and the first lower electrode 71. The second upper electrode 82 may be electrically connected to the second word line 56 through the second phase change pattern $R_H$ 78 and the second lower electrode 72.

Spacers 63 may be disposed (or formed) on inner walls of the contact holes 61 and 62. The spacers 63 may be formed of an insulating layer (e.g., a silicon oxide layer, a silicon nitride layer, a silicon oxynitride layer or a combinations thereof. The spacers 63 may be interposed between the phase change patterns $R_L$ 77 and $R_H$ and the interlayer insulating layer 57. The spacers 63 may be interposed between the lower electrodes 71 and 72 and the interlayer insulating layer 57.

An upper insulating layer 85 may be formed over the interlayer insulating layer 57 and the upper electrodes 81 and 82. Upper surfaces of the upper electrodes 81 and 82 may be exposed on the upper insulating layer 85. The upper insulating layer 85 may be an insulating layer (e.g., a silicon oxide layer, a silicon nitride layer, a silicon oxynitride layer or combinations thereof. Bit lines BL1 87, BL2 and BL3 that are parallel to each other may be disposed (or formed) on the upper insulating layer 85. The bit lines BL1 87, BL2 and BL3 may be formed of a conductive material layer. For example, a first bit line BL1 87 may be in contact with (or to) the first and second upper electrodes 81 and 82.

A program current may be applied to the first bit line BL1 87 and the first word line WL1 55 to convert a first transition volume 91 that is a portion of the first phase change pattern $R_L$ 77 into either an amorphous state or a crystalline state. A program current may be applied to the first bit line BL1 87 and the second word line WL2 56 to convert a second transition volume 92 that is a portion of the second phase change pattern $R_H$ 78 into either an amorphous state or a crystalline state.

The first transition volume 91 may be disposed (or formed) adjacent to the first surface S1. The second transition volume 92 may be disposed (or formed) adjacent to the second surface S2. The second surface S2 may be disposed (or formed) spaced apart from the first surface S1 by a second distance D2. The second surface S2 may be disposed (or formed) at a higher level than the first surface S1. The second distance D2 may be relatively greater than the first distance D1. A distance between the first surface S1 and the second surface S2 may be substantially greater than a distance between the first surface S1 and the second lower electrode 72.

The second transition volume 92 may be formed at a higher level than the first transition volume 91. The first phase change pattern $R_L$ 77 may correspond to the low phase change pattern $R_L$ of FIG. 2. The second phase change pattern $R_H$ 78 may correspond to the high phase change pattern $R_H$ of FIG. 2.

Heat generated at an interface between the first surface S1 and the first phase change pattern $R_L$ 77 and transferred to the second phase change pattern $R_H$ 78 through the interlayer insulating layer 57 may be substantially lower compared to the conventional art. Heat generated at an interface between the second surface S2 and the second phase change pattern $R_H$ 78 and transferred to the first phase change pattern $R_L$ 77 through the interlayer insulating layer 57 may be substantially lower compared to the conventional art. Thermal interference effects between the phase change patterns $R_L$ 77 and $R_H$ 78 may decrease.

Figure 5:
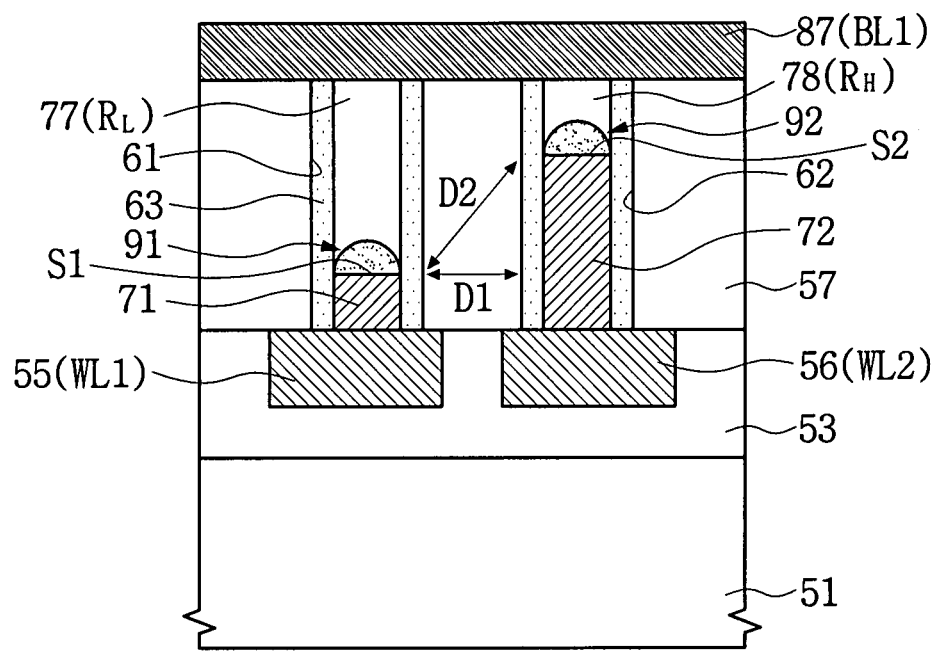

FIG. 5 is a diagram illustrating cross-sectional view of a phase change memory device where a variation is made according to example embodiments.

Referring to FIG. 5, the upper insulating layer 85 and the first and second electrodes 81 and 82 described with reference to FIG. 4 may be omitted. The first bit line BL1 87 may be disposed (or formed) on the interlayer insulating layer 57. The first bit line BL1 87 may be in contact with the first phase change pattern $R_L$ 77 and the second phase change pattern $R_H$ 78.

Figure 6:
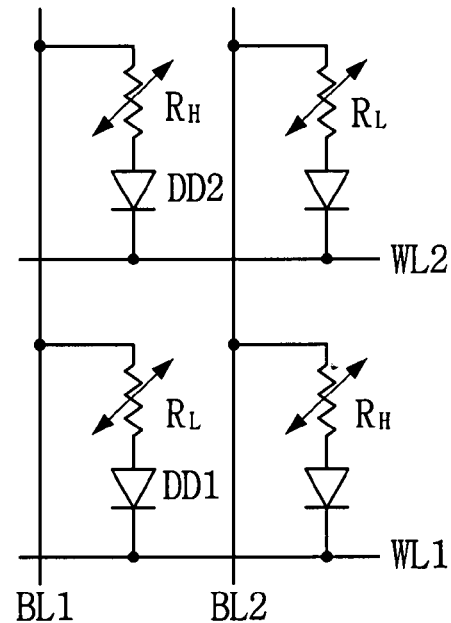
Figure 7:
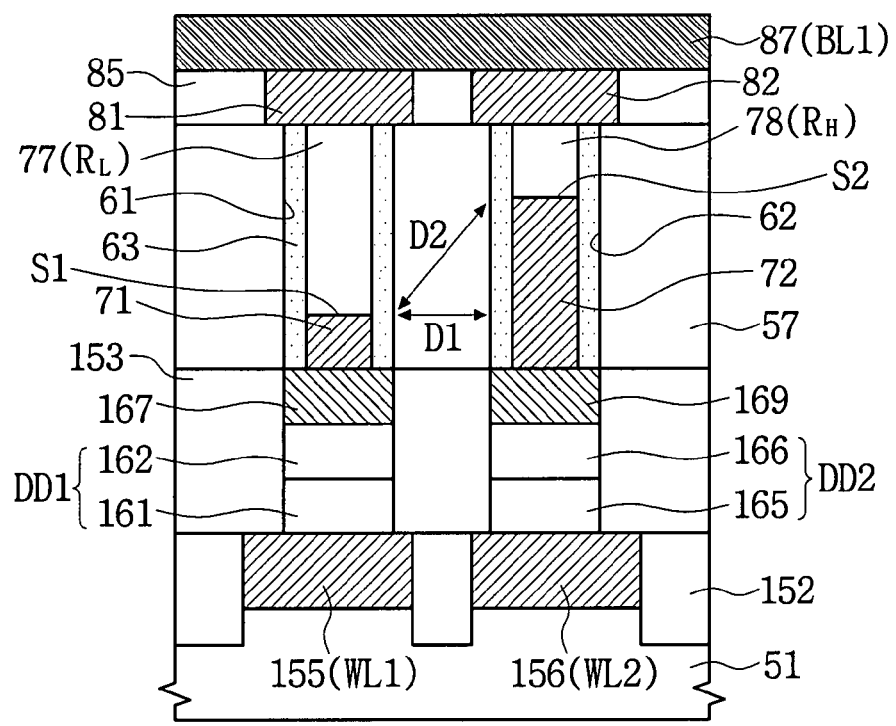

FIG. 6 is an equivalent circuit diagram of a portion of a cell array region of a phase change memory device according to example embodiments. FIG. 7 is a diagram illustrating a cross-sectional view of a portion of a cell array region of the phase change memory device according to example embodiments. FIG. 7 may represent a cross-sectional view of a portion of the cell array region of FIG. 6.

Referring to FIG. 6, the phase change memory device may include first and second word lines WL1 and WL2 parallel to each other in a row (or horizontal) direction, first and second bit lines BL1 and BL2 parallel to each other in a column (or vertical) direction, and a plurality of phase change patterns $R_L$ and $R_H$. Each of the phase change patterns $R_L$ and $R_H$ may be electrically connected to one of the bit lines BL1 and BL2. Switching devices may be disposed (or formed) between the phase change patterns $R_L$ and $R_H$ and the word lines WL1 and WL2. The switching devices may be diodes DD1 and DD2 serially connected to the phase change patterns $R_L$ and $R_H$. One terminal of each of the diodes DD1 and DD2 may be electrically connected to one of the word lines WL1 and WL2. The switching device may be a metal-oxide semiconductor (MOS) transistor.

The phase change patterns $R_L$ and $R_H$ may include a first transition volume or a second transition volume. The transition volumes may be disposed (or formed) at different levels from each other. The second transition volume may be disposed (or formed) at a higher level than the first transition volume. The phase change patterns $R_L$ and $R_H$ may be divided into low phase change patterns $R_L$ having the first transition volume and high phase change patterns $R_H$ having the second transition volume.

The bit lines BL1 and BL2 may be disposed (or formed) to cross the word lines WL1 and WL2. The phase change patterns $R_L$ and $R_H$ may be disposed (or formed) at intersections of the bit lines BL1 and BL2 and the word lines WL1 and WL2. The low phase change pattern $R_L$ may be disposed (or formed) at an intersection of the first bit line BL1 and the first word line WL1. The high phase change pattern $R_H$ may be disposed (or formed) at an intersection of the first bit line BL1 and the second word line WL2.

The high phase change pattern $R_H$ may be disposed (or formed) at an intersection of the second bit line BL2 and the first word line WL1. The low phase change pattern $R_L$ may be disposed (or formed) at an intersection of the second bit line BL2 and the second word line WL2.

Referring to FIGS. 6 and 7, the phase change memory device according to example embodiments may include word line WL1 word line 155, word line WL2 156, bit line BL1 87 and bit line BL2 provided on a substrate 51.

An isolation layer 152 defining line-type active regions parallel to each other may be disposed (or formed) in the substrate 51. The isolation layer 152 may be an insulating layer (e.g., a silicon oxide layer, a silicon nitride layer, a silicon oxynitride layer or combinations thereof. First word line WL1 155 and second word line WL2 156 may be disposed (or formed) parallel to each other in the active regions. The word line WL1 155 and word line WL2 156 may be a semiconductor pattern with an impurity implanted in the semiconductor pattern.

A lower insulating layer 153 may be provided on the substrate 51 having the word line WL1 155 and word line WL2 156. The lower insulating layer 153 may be an insulating layer (e.g., a silicon oxide layer, a silicon nitride layer, a silicon oxynitride layer or combinations thereof. First diode DD1 and second diode DD2 may be spaced apart from each other in the lower insulating layer 153.

The first diode DD1 may include a first lower semiconductor pattern 161 and a first upper semiconductor pattern 162. The first lower semiconductor pattern 161 may be an n-type or p-type semiconductor layer. The first upper semiconductor pattern 162 may be a semiconductor layer of a different conductivity type from the first lower semiconductor pattern 161. If the first lower semiconductor pattern 161 is an n-type semiconductor layer, the first upper semiconductor pattern 162 may be a p-type semiconductor layer.

The first lower semiconductor pattern 161 and the first upper semiconductor pattern 162 may be sequentially stacked on a desired region of the first word line WL1 155. The first lower semiconductor pattern 161 may be in contact with the first word line WL1 155. A first diode electrode 167 may be disposed (or formed) on the first upper semiconductor pattern 162. The first diode electrode 167 may be a conductive layer (e.g., a metal layer or a metal silicide layer). The first diode electrode 167 may be omitted.

The second diode DD2 may include a second lower semiconductor pattern 165 and a second upper semiconductor pattern 166, which are sequentially stacked. The second lower semiconductor pattern 165 may be in contact with the second word line WL2 156. A second diode electrode 169 may be disposed (or formed) on the second upper semiconductor pattern 166. The second diode electrode 169 may be a conductive layer (e.g., a metal layer or a metal silicide layer). The second diode electrode 169 may be omitted.

Upper surfaces of the lower insulating layer 153 and the diode electrodes 167 and 169 may be exposed on the same plane.

An interlayer insulating layer 57 may be provided on the lower insulating layer 153. First and second contact holes 61 and 62 passing through the interlayer insulating layer 57 may be disposed (or formed) on the diode electrodes 167 and 169, respectively. The first and second contact holes 61 and 62 may be spaced apart from each other by a first distance D1. First and second electrodes 71 and 72 may be disposed (or formed) in the first and second contact holes 61 and 62, respectively. The first and second electrodes 71 and 72 may be in contact with the diode electrodes 167 and 169, respectively. The first and second electrodes 71 and 72 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

The first and second electrodes 71 and 72 will be respectively referred to as a first lower electrode 71 and a second lower electrode 72 for clarity.

The first lower electrode 71 may include a first surface S1 in the first contact hole 61. The second lower electrode 72 may include a second surface S2 in the second contact hole 62. The first and second surfaces S1 and S2 may be disposed (or formed) at different levels from each other. The second surface S2 may be disposed (or formed) at a higher level than the first surface S1.

A first phase change pattern $R_L$ 77 filling the first contact hole 61 may be provided on the first lower electrode 71. A second phase change pattern $R_H$ 78 filling the second contact hole 62 may be provided on the second lower electrode 72. The first phase change pattern $R_L$ 77 may be in contact with the first surface S1. The second phase change pattern $R_H$ 78 may be in contact with the second surface S2. The first phase change pattern $R_L$ 77 and the second phase change pattern $R_H$ 78 may be formed of two or more compounds selected from the group consisting of Te, Se, Ge, Sb, Bi, Pb, Sn, Ag, As, S, Si, P, O, C and combinations thereof.

Upper surfaces of the first phase change pattern $R_L$ 77 and the second phase change pattern $R_H$ 78 may be exposed on the same plane. The interlayer insulating layer 57, the first phase change pattern $R_L$ 77 and the second phase change pattern $R_H$ 78 may be exposed on the same plane.

Third and fourth electrodes 81 and 82 may be disposed (or formed) on the interlayer insulating layer 57. The third and fourth electrodes 81 and 82 will be respectively referred to as a first upper electrode 81 and a second upper electrode 82 below for the sake of clarity.

The first upper electrode 81 may be in contact with the first phase change pattern $R_L$ 77. The second upper electrode 82 may be in contact with the second phase change pattern $R_H$ 78. The first upper electrode 81 may be electrically connected to the first word line 155 through the first phase change pattern $R_L$ 77 and the first lower electrode 71. The second upper electrode 82 may be electrically connected to the second word line 156 through the second phase change pattern $R_H$ 78 and the second lower electrode 72.

Spacers 63 may be disposed (or formed) on inner walls of the contact holes 61 and 62. The spacers 63 may be interposed (or formed) between the phase change patterns $R_L$ 77 and $R_H$ 78 and the interlayer insulating layer 57. The spacer 63 may be interposed (or formed) between the lower electrodes 71 and 72 and the inner layer insulating layer 57.

An upper insulating layer 85 may be formed over the interlayer insulating layer 57 and the upper electrodes 81 and 82. Upper surfaces of the upper electrodes 81 and 82 may be exposed on the upper insulating layer 85. The bit lines BL1 87 and BL2 that are parallel to each other may be disposed (or formed) on the upper insulating layer 85. A first bit line BL1 and 87 may be in contact with the first and second upper electrodes 81 and 82.

A described with reference to FIG. 5, the upper insulating layer 85 and the first and second upper electrodes 81 and 82 may be omitted. The bit line BL1 87 may be disposed (or formed) on the interlayer insulating layer 57. The first bit line BL1 87 may be in contact with the first phase change pattern $R_L$ 77 and the second phase change pattern $R_H$ 78.

As described with reference to FIG. 4, the second surface S2 may be spaced apart from the first surface S1 by a second distance D2. The second surface S2 may be disposed (or formed) at a higher level than the first surface S1. The second distance D2 may be substantially greater than the first distance D1. Thermal interference effects between the phase change patterns $R_L$ 77 and $R_H$ 78 may decrease.

Figure 8:
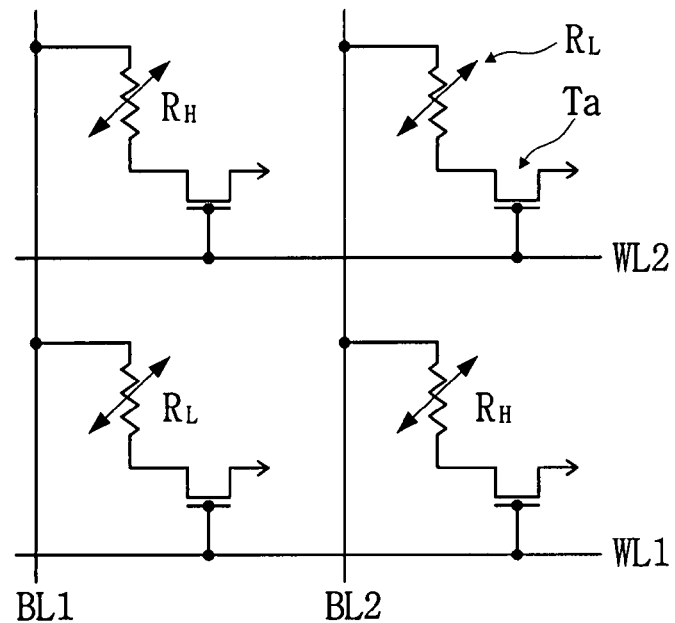
Figure 9:
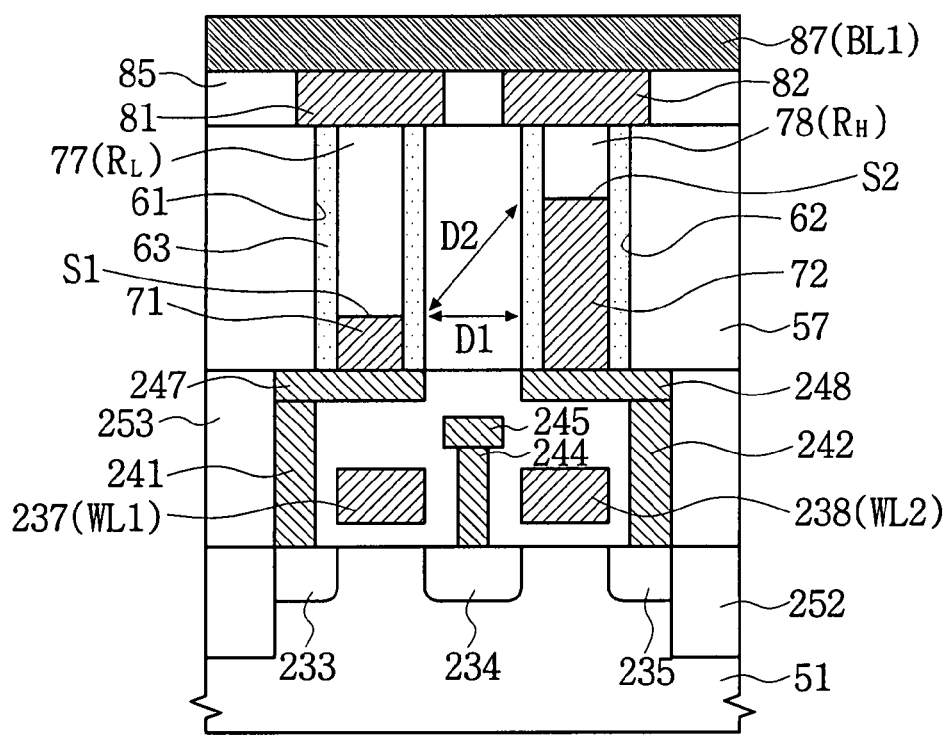

FIG. 8 is an equivalent circuit diagram of a portion of a cell array region of a phase change memory device according to example embodiments. FIG. 9 is a diagram illustrating a cross-sectional view of a portion of a cell array region of the phase change memory device according to example embodiments. FIG. 9 may represent a cross-sectional view of a portion of the cell array region of FIG. 8.

Referring to FIG. 8, the phase change memory device may include first and second word lines WL1 and WL2 parallel to each other in a row (or horizontal) direction, first and second bit lines BL1 and BL2 parallel to each other in a column (or vertical) direction and a plurality of phase change patterns $R_L$ and $R_H$. Each of the phase change patterns $R_L$ and $R_H$ may be electrically connected to one of the bit lines BL1 and BL2. Switching devices may be disposed (or formed) between the phase change patterns $R_L$ and $R_H$ and the word lines WL1 and WL2. The switching devices may be transistors Ta serially connected to the phase change patterns $R_L$ and $R_H$. One terminal of each of the transistors Ta may be electrically connected to one of the word lines WL1 and WL2.

The phase change patterns $R_L$ and $R_H$ may include a first transition volume or a second transition volume. The transition volumes may be disposed (or formed) at different levels from each other. The second transition volume may be disposed (or formed) at a higher level than the first transition volume. The phase change patterns $R_L$ and $R_H$ may be divided into low phase change patterns $R_L$ having the first transition volume and high phase change patterns $R_H$ having the second transition volume.

The bit lines BL1 and BL2 may be disposed (or formed) to cross the word lines WL1 and WL2. The phase change patterns $R_L$ and $R_H$ may be disposed (or formed) at intersections of the bit lines BL1 and BL2 and the word lines WL1 and WL2. The low phase change pattern $R_L$ may be disposed (or formed) at an intersection of the first bit line BL1 and the first word line WL1. The high phase change pattern $R_H$ may be disposed (or formed) at an intersection of the first bit line BL1 and the second word line WL2.

The high phase change pattern $R_H$ may be disposed (or formed) at an intersection of the second bit line BL2 and the first word line WL1. The low phase change pattern $R_L$ may be disposed (or formed) at an intersection of the second bit line BL2 and the second word line WL2.

Referring to FIGS. 8 and 9, the phase change memory device according to example embodiments may include word lines WL1 237 and WL2 238 and bit lines BL1 87 and BL2 provided on a substrate 51.

An isolation layer 252 defining an active region may be disposed (or formed) in the substrate 51. The isolation layer 252 may be an insulating layer (e.g., a silicone oxide layer, a silicon nitride layer, a silicon oxynitride layer or combinations thereof). First and second word lines WL1 237 and WL2 238 may be disposed (or formed) parallel to each other. The word lines WL1 237 and WL2 238 may be a conductive layer (e.g., a polysilicon layer, a metal layer, a metal silicide layer or combinations thereof). source/drain region 235 may be disposed (or formed) in the active region disposed at both sides of the word lines WL1 237 and WL2 238. The second source/drain region 234 may be disposed between the word lines WL1 237 and WL2 238.

A lower insulating layer 253 may be formed over the substrate 51 including the word lines WL1 237 and WL2 238. The lower insulating layer 253 may be an insulating layer (e.g., a silicon oxide layer, a silicon nitride layer, a silicon oxynitride layer or combinations thereof). First plug 241, second plug 242 and third plug 244 may be disposed in the lower insulating layer 253 to be spaced apart from one another. The first plug 241 may be in contact with the first source/drain region 233. The second plug 242 may be in contact with the third source/drain region 235. The third plug 244 may be in contact with the second source/drain region 234.

A first pad 247 may be disposed (or formed) on the first plug 241. A second pad 248 may be disposed (or formed) on the second plug 242. Upper surfaces of the lower insulating layer 253 and the pads 247 and 248 may be exposed on the same plane. The third plug 244 may be in contact with a common interconnection 245 disposed in the lower insulating layer 253. The plug 241, plug 242, plug 244, the common interconnection 245, pad 247 and pad 248 may be a conductive layer (e.g., a polysilicon layer, a metal layer, a metal silicide layer or combinations thereof. The pads 247 and 248 may be omitted.

An interlayer insulating layer 57 may be provided on the lower insulating layer 253. First and second contact holes 61 and 62 passing through the interlayer insulating layer 57 may be disposed (or formed) on the pads 247 and 248, respectively. The first and second contact holes 61 and 62 may be spaced apart from each other by a first distance D1. First and second electrodes 71 and 72 may be disposed (or formed) in the contact holes 61 and 62, respectively. The first and second electrodes 71 and 72 may be in contact with the first and second pads 247 and 248, respectively. The first and second electrodes 71 and 72 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

Each of the first and second electrodes 71 and 72 will be referred to as a first lower electrode 71 and a second lower electrode 72 below for the sake of clarity.

The first lower electrode 71 may include a first surface S1 in the first contact hole 61. The second lower electrode 72 may include a second surface S2 in the second contact hole 62. The first and second surfaces S1 and S2 may be disposed (or formed) at different levels from each other. The second surface S2 may be disposed at a higher level than the first surface S1.

A first phase change pattern $R_L$ 77 filling the first contact hole 61 may be provided on the first lower electrode 71. A second phase change pattern $R_H$ 78 filling the second contact hole 62 may be provided on the second lower electrode 72. The first phase change pattern $R_L$ 77 may be in contact with the first surface S1. The second phase change pattern $R_H$ 78 may be in contact with the second surface S2. The first phase change pattern $R_L$ 77 and the second phase change pattern $R_H$ 78 may be formed of two or more compounds selected from the group consisting of Te, Se, Ge, Sb, Bi, Pb, Sn, Ag, As, S, Si, P, O, C and combinations thereof.

Upper surfaces of the first phase change pattern $R_L$ 77 and the second phase change pattern $R_H$ 78 may be exposed on the same plane. The interlayer insulating layer 57, the first phase change pattern $R_L$ 77, and the second phase change pattern $R_H$ 78 may be exposed on the same plane.

Third and fourth electrodes 81 and 82 may be disposed on the interlayer insulating layer 57. The third and fourth electrodes 81 and 82 will be respectively referred to as a first upper electrode 81 and a second upper electrode 82 for the sake of clarity.

The first upper electrode 81 may be in contact with the first phase change pattern $R_L$ 77. The second upper electrode 82 may be in contact with the second phase change pattern $R_H$ 78.

Spacers 63 may be disposed (or formed) on inner walls of the contact holes 61 and 62. The spacers 63 may be interposed between the phase change patterns $R_L$ 77 and $R_H$ 78 and the interlayer insulating layer 57. The spacers 63 may be interposed between the lower electrodes 71 and 72 and the interlayer insulating layer 57.

An upper insulating layer 85 may be formed on the interlayer insulating layer 57 and the upper electrodes 81 and 82. Upper surfaces of the upper electrodes 81 and 82 may be exposed on the upper insulating layer 85. The bit lines BL1 87 and BL2 that are parallel to each other may be disposed (or formed) on the upper insulating layer 85. A first bit line BL1 and 87 may be in contact with the first and second upper electrodes 81 and 82.

As described with reference to FIG. 5, the upper insulating layer 85 and the first and second upper electrodes 81 and 82 may be omitted. The first bit line BL1 87 may be disposed (or formed) on the interlayer insulating layer 57. The first bit line BL1 87 may be in contact with the first phase change pattern $R_L$ 77 and the second phase change pattern $R_H$ 78.

The bit lines BL1 87 and BL2 may be replaced with a plate electrode (not shown). The common interconnection 245 may function as a bit line.

As described with reference to FIG. 4, the second surface S2 may be disposed (or formed) to be spaced apart from the first surface S1 by a second distance :D2. The second surface S2 may be disposed (or formed) at a higher level than the first surface S1. The second distance D2 may be relatively greater than the first distance D1. Thermal interference effects between the phase change patterns $R_L$ 77 and $R_H$ 78 may decrease.

FIGS. 10 to 17 are diagrams illustrating cross-sectional views taken along line I-I' of FIG. 3 of a method of fabricating the phase change memory device according to example embodiments.

Figure 10:
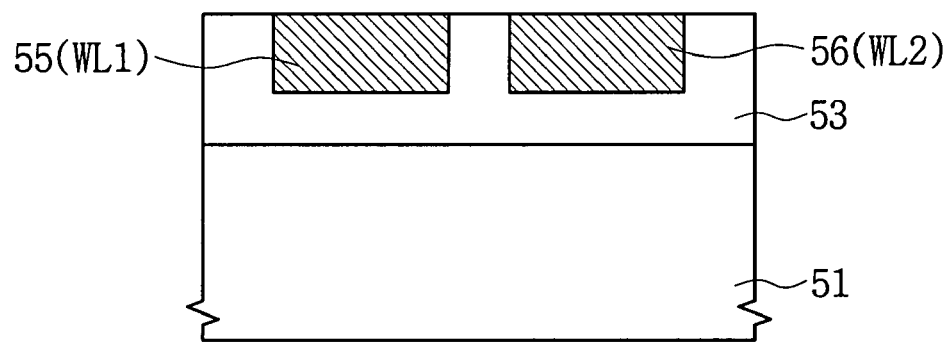

Referring to FIGS. 3 and 10, a lower insulating layer 53 may be formed on a substrate 51. The substrate 51 may be a semiconductor substrate (e.g., a silicon wafer). The lower insulating layer 53 may be an insulating layer (e.g., a silicon oxide layer, a silicon nitride layer, a silicon oxynitride layer or combinations thereof).

First and second word lines WL1 55 and WL2 56 parallel to each other may be disposed (or formed) in the lower insulating layer 53. An upper surface of the lower insulating layer 53 and upper surfaces of the first and second word lines WL1 55 and WL2 56 may be exposed on the same plane. The first and second word lines WL1 55 and WL2 and 56 may be a conductive pattern (e.g., a polysilicon pattern, an interconnection or an epitaxial semiconductor pattern).

Figure 11:
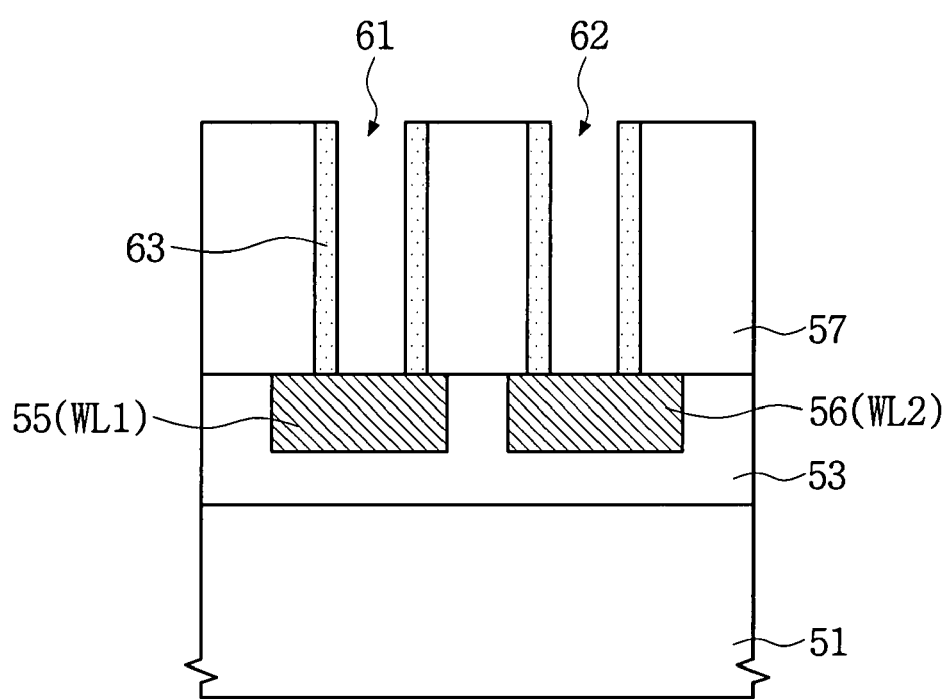

Referring to FIGS. 3 and 11, an interlayer insulating layer 57 may be provided on the word lines WL1 55 and WL2 56 and the lower insulating layer 53. The interlayer insulating layer 57 may be an insulating layer (e.g., a silicon oxide layer, a silicon nitride layer, a silicon oxynitride layer or combinations thereof). An upper surface of the interlayer insulating layer 57 may be planarized.

First and second contact holes 61 and 62 passing through the interlayer insulating layer 57 may be formed on the word lines WL1 55 and WL2 56. The first and second contact holes 61 and 62 may be spaced apart from each other by a first distance D1. Upper surfaces of the word lines WL1 55 and WL2 56 may be exposed in the contact holes 61 and 62.

Spacers 63 may be formed on inner walls of the contact hole 61 and 62. The spacers 63 may be formed of an insulating layer (e.g., a silicon oxide layer, a silicon nitride layer, a silicon oxynitride layer or combinations thereof).

Figure 12:
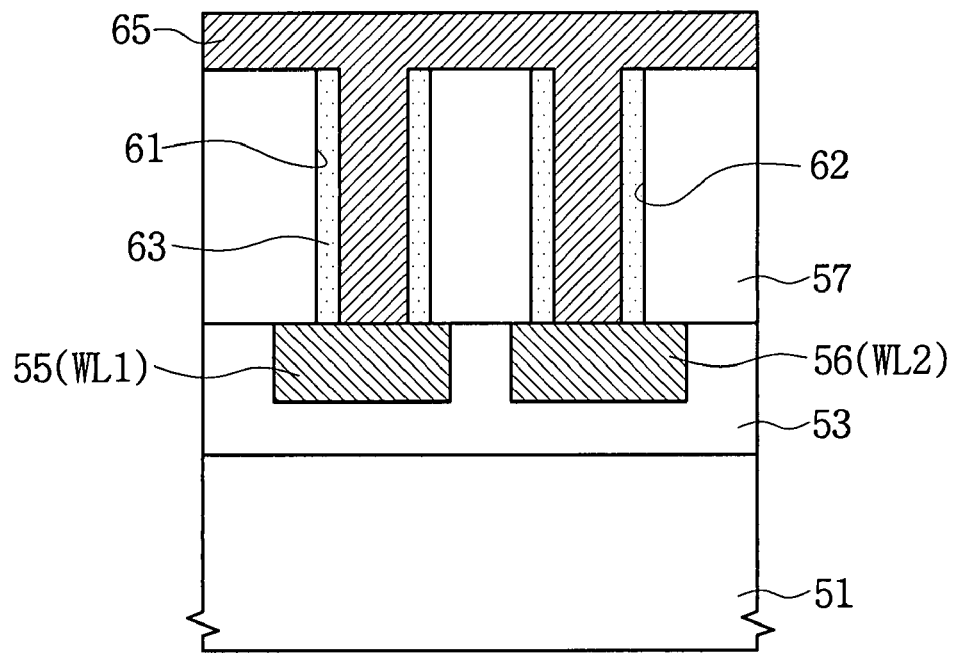

Referring to FIGS. 3 and 12, a lower electrode layer 65 may be formed filling the contact holes 61 and 62 and covering the substrate 51.

The lower electrode 65 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

Figure 13:
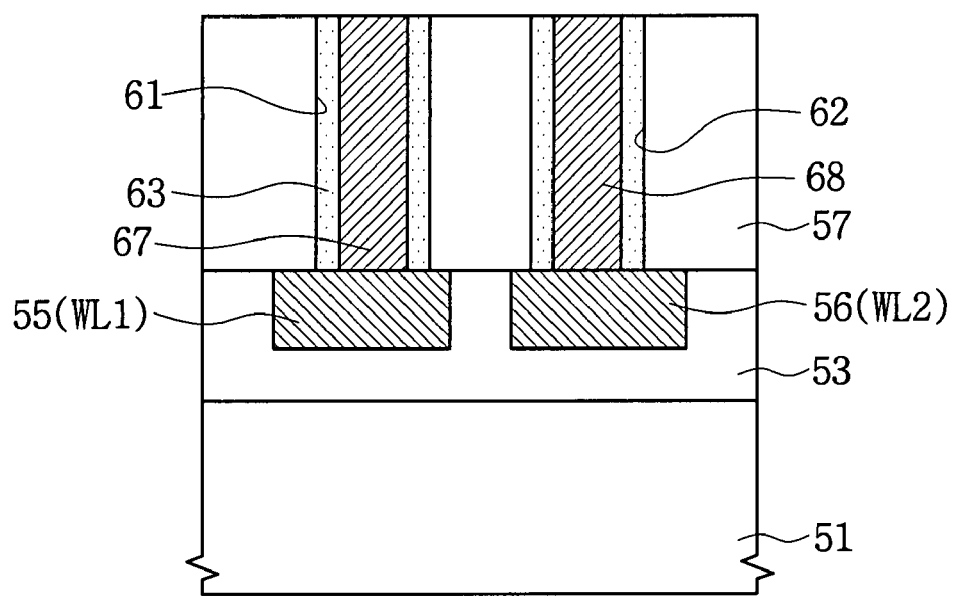

Referring to FIGS. 3 and 13, the lower electrode layer 65 may be planarized to respectively form first and second preliminary electrodes 67 and 68 in the contact holes 61 and 62.

A chemical mechanical polishing (CMP) process that adopts (or uses) the interlayer insulating layer 57 as a stop layer may be applied to the planarization. The preliminary electrodes 67 and 68 may be formed by an etch-back process.

Figure 14:
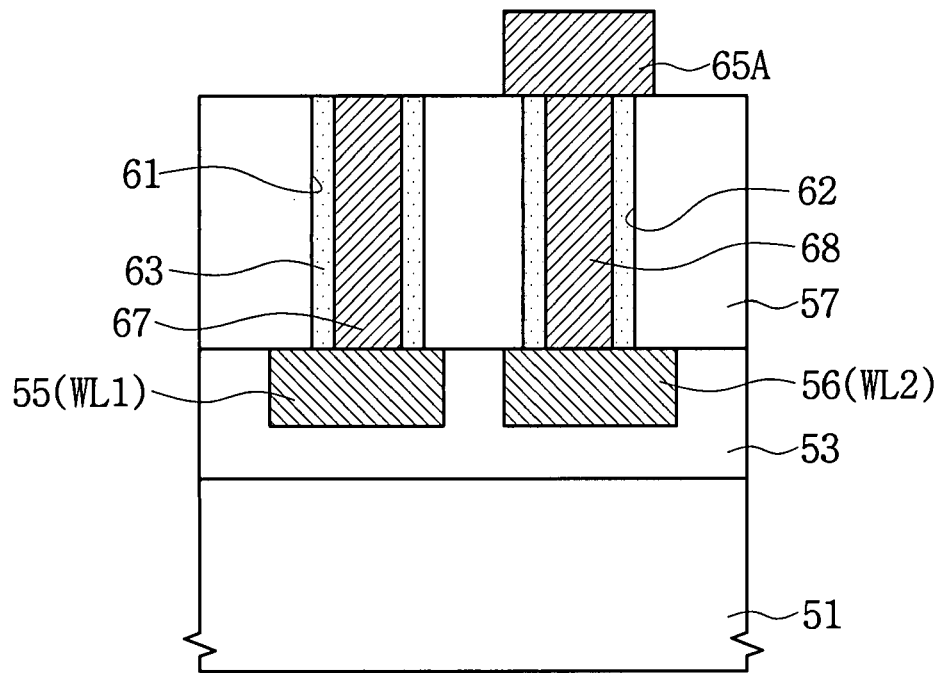

Referring to FIGS. 3 and 14, a sacrificial electrode 65A may be formed on the second preliminary electrode 68. The sacrificial electrode 65A may be formed of the same material layer as the second preliminary electrode 68. The sacrificial electrode 65A may be formed of a different material layer than the second preliminary electrode 68. The sacrificial electrode 65A may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

Figure 15:
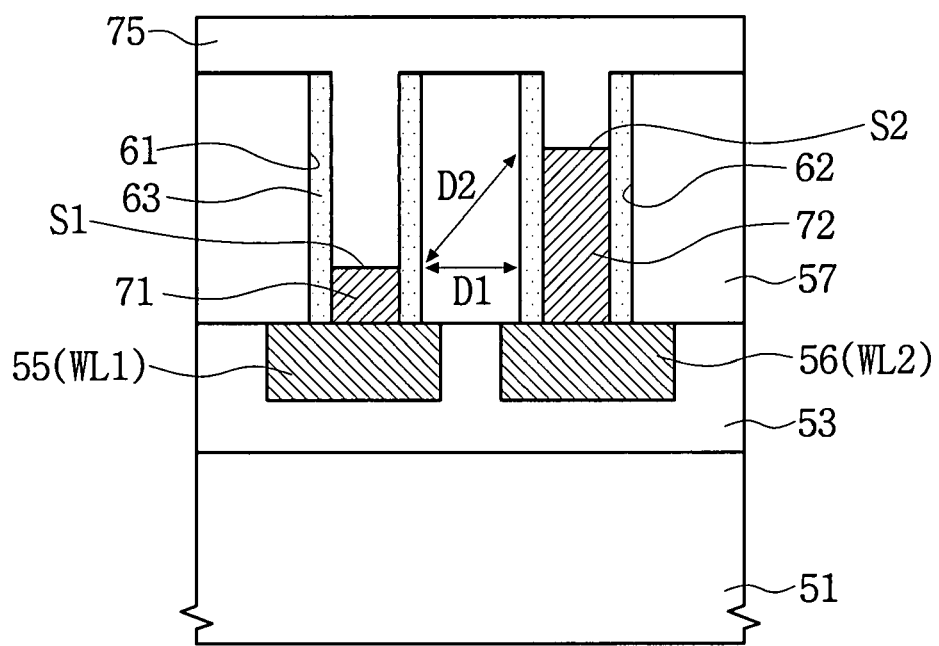

Referring to FIGS. 3 and 15, a first lower electrode 71 having a first surface S1 may be formed in the first contact hole 61 by etching-back the first preliminary electrode 67. Simultaneously, a second lower electrode 72 having a second surface S2 may be formed in the second contact hole 62 by etching-back the sacrificial electrode 65A and the second preliminary electrode 68. The second surface S2 may be formed at a higher level than the first surface S1. The first and second lower electrodes 71 and 72 may be in contact with the first and second word lines WL1 55 and WL2 56, respectively.

The first and second contact holes 61 and 62 may be spaced apart from each other by a first distance D1. The second surface S2 may be spaced apart from the first surface S1 by a second distance D2. The second distance D2 may be relatively greater than the first distance D1.

A phase change material layer 75 filling the remaining portions of the contact holes 61 and 62 and covering the substrate 51 may be formed on the lower electrodes 71 and 72. The phase change material layer 75 may be formed of two or more compounds selected from the group consisting of Te, Se, Ge, Sb, Bi, Pb, Sn, Ag, As, S, Si, P, O, C and combinations thereof. The phase change material layer 75 may be in contact with the first surface S1 and the second surface S2.

Figure 16:
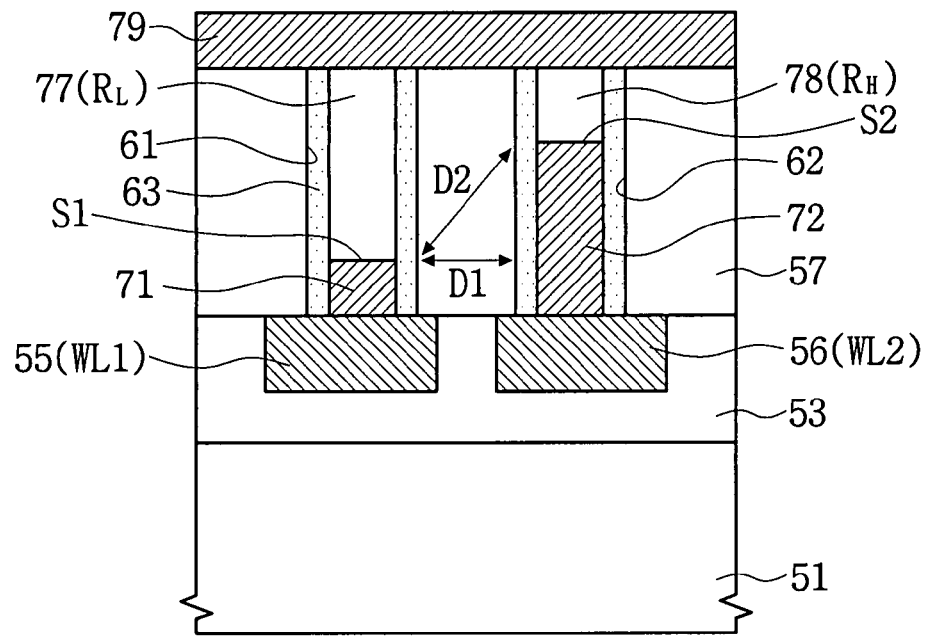

Referring to FIGS. 3 and 16, the phase change material layer 75 may be planarized to form the first phase change pattern $R_L$ 77 filling the first contact hole 61 and the second phase change pattern $R_H$ 78 filling the second contact hole 62.

A chemical mechanical polishing (CMP) process that adopts (or uses) the interlayer insulating layer 57 as a stop layer may be applied to the planarization. The first and second phase change patterns $R_L$ 77 and $R_H$ 78 may be formed by an etch-back process. Upper surfaces of the interlayer insulating layer 57, the first phase change pattern $R_L$ and 77, and the second phase change pattern $R_H$ 78 may be exposed on the same plane.

An upper electrode layer 79 may be formed on the interlayer insulating layer 57. The upper electrode layer 79 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

Figure 17:
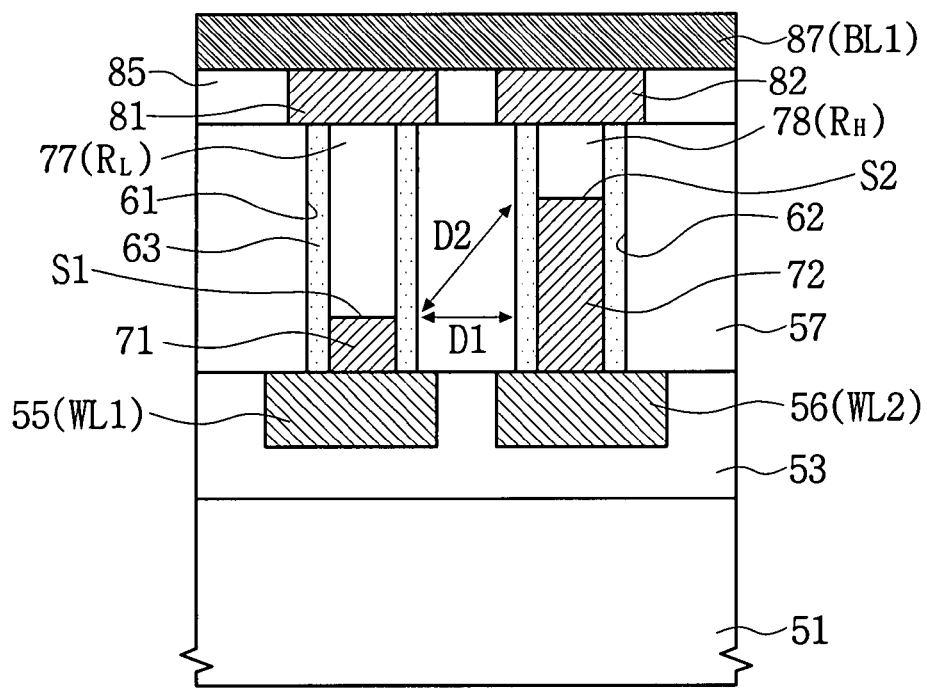

Referring to FIGS. 3 and 17, the upper electrode layer 79 may be patterned to form first and second upper electrodes 81 and 82.

The first upper electrode 81 may be in contact with the first phase change pattern $R_L$ 77. The second upper electrode 82 may be in contact with the second phase change pattern $R_H$ 78. The first upper electrode 81 may be electrically connected to the first word line 55 through the phase change pattern $R_L$ 77 and the first lower electrode 71. The second upper electrode 82 may be electrically connected to the second word line 56 through the second phase change pattern $R_H$ 78 and the second lower electrode 72.

An upper insulating layer 85 may be formed on the interlayer insulating layer 57. Upper surfaces of the upper electrodes 81 and 82 may be exposed. The upper insulating layer 85 may be an insulating layer (e.g., a silicon oxide layer, a silicon nitride layer, a silicon oxynitride layer or combinations thereof).

A bit line BL1 87 in contact with the upper electrodes 81 and 82 may be formed on the upper insulating layer 85. The bit line BL1 87 may be formed of a conductive material layer.

As described with reference to FIG. 5, forming the upper insulating layer 85 and the first and second upper electrodes 81 and 82 may be omitted. The first bit line BL1 87 may be formed on the interlayer insulating layer 57. The first bit line BL1 87 may be in contact with the first phase change pattern $R_L$ 77 and the second phase change pattern $R_H$ 78.

Figure 18:
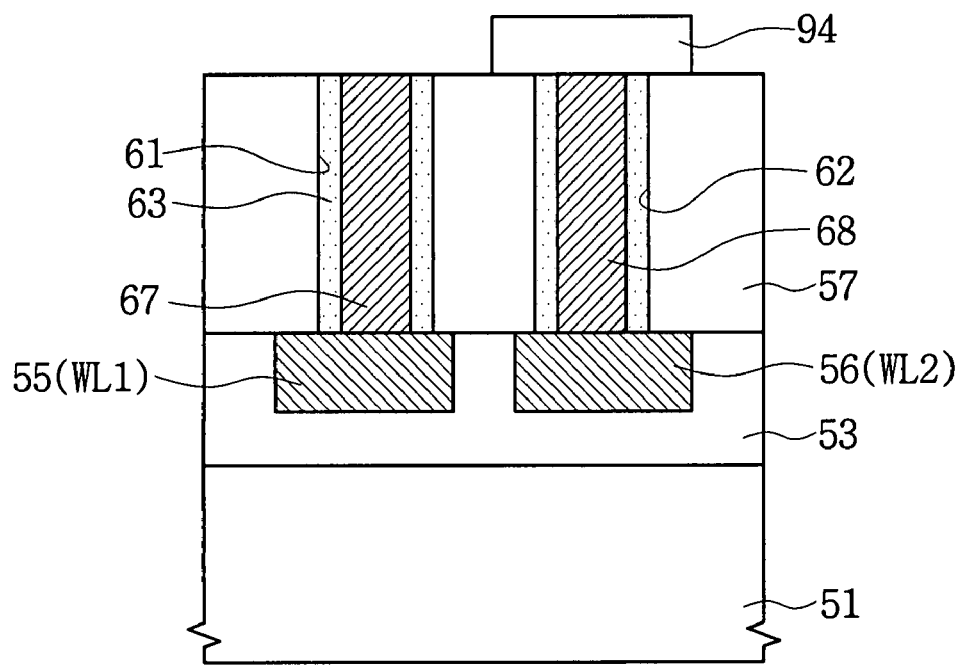
Figure 19:
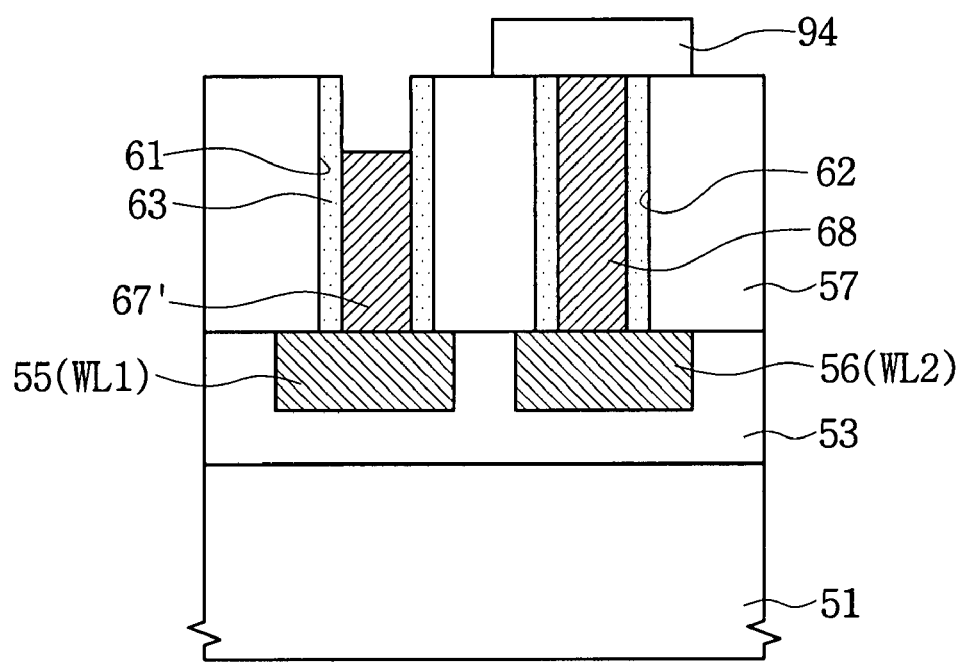
Figure 20:
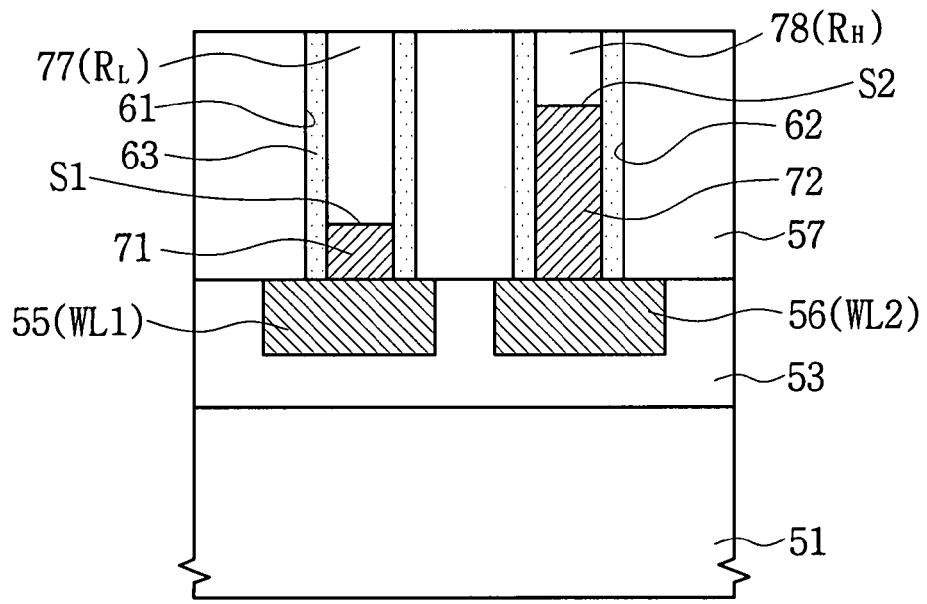

FIGS. 18 to 20 are diagrams illustrating cross-sectional views taken along line I-I' of FIG. 3 of another method of fabricating the phase change memory device according to example embodiments.

Referring to FIGS. 3 and 18, as described with reference to FIGS. 10 to 13, a: lower insulating layer 53, first and second word lines WL1 55 and WL2 56, an interlayer insulating layer 57, first and second contact holes 61 and 62, spacers 63, and first and second preliminary electrodes 67 and 68 may be formed on a substrate 51. Upper surfaces of the interlayer insulating layer 57 and the preliminary electrodes 67 and 68 may be exposed on the same plane.

A sacrificial pattern 94 formed over the second preliminary electrode 68 may be formed on the interlayer insulating layer 57. The sacrificial pattern 94 may be a photoresist pattern or a hard mask pattern. The hard mask pattern may be formed of a silicon nitride layer, a silicon oxynitride layer, a silicon oxide layer or combinations thereof.

Referring to FIGS. 3 and 19, the first preliminary electrode 67 may be etched using the sacrificial pattern 94 as an etch mask to form a recessed preliminary electrode 67'. The sacrificial pattern 94 may protect the second preliminary electrode 68 from being damaged during the etching of the first preliminary electrode 67. The recessed preliminary electrode 67' may remain at a lower level than an upper surface of the second preliminary electrode 68.

Referring to FIGS. 3 and 20, the sacrificial pattern 94 may be removed to expose the second preliminary electrode 68.

The recessed preliminary electrode 67' and the second preliminary electrode 68 may be etched to form a first lower electrode 71 and a second lower electrode 72. The recessed preliminary electrode 67' and the second preliminary electrode 68 may be etched using an etch-back process. The first lower electrode 71 may be formed with a first surface S1 in the first contact hole 61. The second lower electrode 72 may be formed to have a second surface S2 in the second contact hole 62. The second surface S2 may be disposed (or formed) at a higher level than the first surface S1. The first and second lower electrodes 71 and 72 may be in contact with the first and second word lines WL1 55 and WL2 56, respectively.

First and second phase change patterns $R_L$ 77 and $R_H$ 78 filling remaining parts of the contact holes 61 and 62 may be formed on the lower electrodes 71 and 72. The phase change patterns $R_L$ 77 and $R_H$ 78 may be formed of two or more compounds selected from the group consisting of Te, Se, Ge, Sb, Bi, Pb, Sn, Ag, As, S, Si, P, O, C and combinations thereof. The first and second phase change patterns $R_L$ 77 and $R_H$ 78 may be in contact with the first and second surfaces S1 and S2, respectively. Upper surfaces of the interlayer insulating layer 57 and the phase change patterns $R_L$ 77 and $R_H$ 78 may be exposed on the same plane.

As described with reference to FIGS. 16 and 17, first upper electrode 81, second upper electrode 82, an upper insulating layer 85 and a first bit line BL1 87 may be formed.

In other example embodiments, as described with reference to FIG. 5, forming the upper insulating layer 85 and the first and second upper electrodes 81 and 82 may be omitted. The first bit line BL1 87 may be formed on the interlayer insulating layer 57. The first bit line BL1 87 may be in contact with the first and second phase change patterns $R_L$ 77 and $R_H$ 78.

Figure 21:
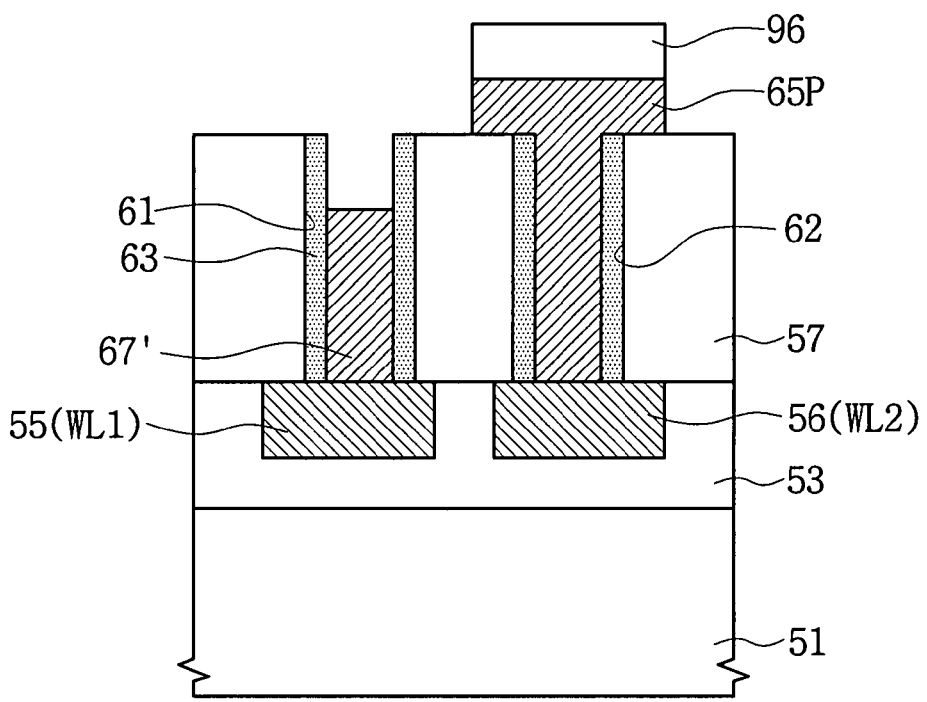
Figure 22:
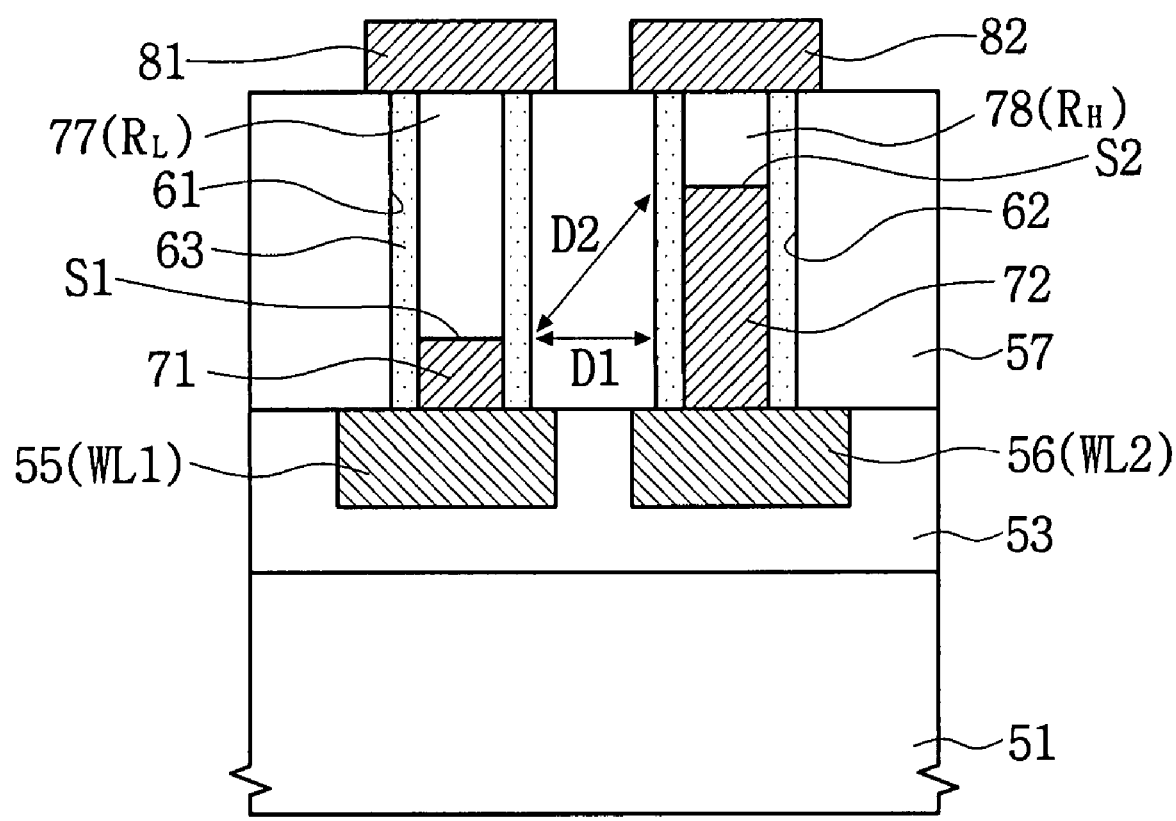

FIGS. 21 and 22 are diagrams illustrating cross-sectional views taken along line I-I' of FIG. 3 of a method of fabricating the phase change memory device according to example embodiments.

Referring to FIGS. 3 and 21, as described with reference to FIGS. 10 to 12, a lower insulating layer 53, first and second word lines WL1 55 and WL2 56, an interlayer insulating layer 57, first and second contact holes 61 and 62, spacers 63, and a lower electrode layer 65 may be formed on a substrate 51.

The lower electrode layer 65 may be formed of a Group IV-VI metal layer, a silicon (Si) layer, a conductive carbon group layer, a copper (Cu) layer and combinations thereof.

The Group IV-VI metal layer may be formed of one selected from the group consisting of Ti, TiSi, TiN, TiON, TiW, TiAlN, TiAlON, TiSiN, TiBN, W, WN, WON, WSiN, WBN, WCN, Ta, TaSi, TaN, TaON, TaAlN, TaSiN, TaCN, Mo, MoN, MoSiN, MoAlN, NbN, ZrSiN, ZrAlN and combinations thereof.

A mask pattern 96 covering (or over) the second contact hole 62 and exposing the first contact hole 61 may be formed on the lower electrode layer 65. The mask pattern 96 may be a photoresist pattern or a mask pattern. The hard mask pattern may be formed of a silicon nitride layer, a silicon oxynitride layer, a silicon oxide layer or combinations thereof.

The lower electrode layer 65 may be etched using the mask pattern 96 as an etch mask to form a recessed preliminary electrode 67' in the first contact hole 61. A patterned lower electrode layer 65P may remain under the mask pattern 96 during the formation of the recessed preliminary electrode 67'. The patterned lower electrode layer 65P may fill the second contact hole 62.

Referring to FIGS. 3 and 22, the mask pattern 96 may be removed to expose the patterned lower electrode layer 65P. The recessed preliminary electrode 67' may remain at a lower level than an upper surface of the patterned lower electrode layer 65P.

The recessed preliminary electrode 67' and the patterned lower electrode layer 65P may be etched to form a first lower electrode 71 and a second lower electrode 72. The recessed preliminary electrode 67' and the patterned lower electrode layer 65P may be etched using an etch-back process. The first lower electrode 71 may be formed to have a first surface S1 in the first contact hole 61. The second lower electrode 72 may be formed with a second surface S2 in the second contact hole 62. The second surface S2 may be disposed (or formed) at a higher level than the first surface S1. The first and second lower electrodes 71 and 72 may be in contact with the first and second word lines WL1 55 and WL2 56, respectively.

First and second phase change patterns $R_L$ 77 and $R_H$ 78 filling remaining parts of the contact holes 61 and 62 may be formed on the lower electrodes 71 and 72. The phase change patterns $R_L$ 77 and $R_H$ 78 may be formed of two or more compounds selected from the group consisting of Te, Se, Ge, Sb, Bi, Pb, Sn, Ag, As, S, Si, P, O, C and combinations thereof. The first and second phase change patterns $R_L$ 77 and $R_H$ 78 may be in contact with the first and second surfaces S1 and S2, respectively. Upper surfaces of the interlayer insulating layer 57 and the phase change patterns $R_L$ 77 and $R_H$ 78 may be exposed on the same plane.

First and second upper electrodes 81 and 82, an upper insulating layer 85, and a first bit line BL1 87 may be formed by the same method as that described with reference to FIGS. 16 and 17.

In other example embodiments, as described with reference to FIG. 5, forming the upper insulating layer 85 and the first and second upper electrodes 81 and 82 may be omitted. The first bit line BL1 87 may be formed on the interlayer insulating layer 57. The first bit line BL1 87 may be in contact with the first and second phase change patterns $R_L$ 77 and $R_H$ 78.

As described above, a first electrode having a first surface and a second electrode having a second surface disposed (formed) at a different level from the first surface are provided on a substrate. A first phase change pattern may be formed in contact with the first surface. A second phase change pattern may be formed in contact with the second surface. The second surface may be disposed (or formed) at a higher level than the first surface. Paths, through which heat is generated at interfaces between the first surface and the first phase change pattern and transferred to the second phase change pattern, may be substantially larger compared to the conventional art. Thermal interference effects between the phase change patterns may decrease.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of manufacturing a phase change memory device, comprising:
   forming an interlayer insulating layer on a substrate;
   forming a first contact hole and a second contact hole both passing through the interlayer insulating layer;
   forming a first electrode having a first surface;
   forming a second electrode having a second surface at a different level from the first surface, wherein the second electrode is spaced apart from the first electrode on the interlayer insulating layer;
   forming a first phase change pattern in contact with the first surface of the first electrode; and
   forming a second phase change pattern in contact with the second surface of the second electrode, wherein the first surface and the first phase change pattern are formed in the first contact hole and the second surface and the second phase change pattern are formed in the second contact hole,
   wherein forming the first and second electrodes includes:
   forming a lower electrode layer that fills the first and second contact holes, the lower electrode layer being formed over the substrate,
   planarizing the lower electrode layer,
   forming a first preliminary electrode filling the first contact hole,
   forming a second preliminary electrode filling the second contact hole,
   forming a sacrificial electrode on the second preliminary electrode, and
   etching-back the first preliminary electrode, the sacrificial electrode and the second preliminary electrode.

2. The method of claim 1, further comprising forming spacers on sidewalls of the first and second contact holes.

3. The method of claim 1, wherein the second surface is formed at a higher level than the first surface.

4. The method of claim 1, wherein upper surfaces of the first and second phase change patterns are formed on a same plane.

5. The method of claim 1, wherein forming the first and second phase change patterns includes:
   forming a phase change material layer that fills the first and second contact holes, wherein the phase change material layer is formed over the interlayer insulating layer;
   planarizing the phase change material layer; and
   exposing the interlayer insulating layer.

6. The method of claim 1, wherein the sacrificial electrode is formed of a same material layer as the second preliminary electrode.

7. The method of claim 1, further comprising:
   forming word lines electrically connected to the first and second electrodes on the substrate; and
   forming a bit line electrically connected to the first and second phase change patterns.

8. The method of claim 7, further comprising forming a third electrode between the first phase change pattern and the bit line; and
   forming a fourth electrode between the second phase change pattern and the bit line.

9. A method of manufacturing a phase change memory device, comprising:
- forming an interlayer insulating layer on a substrate;
- forming a first contact hole and a second contact hole both passing through the interlayer insulating layer;
- forming a first electrode having a first surface;
- forming a second electrode having a second surface at a different level from the first surface, wherein the second electrode is spaced apart from the first electrode;
- forming a first phase change pattern in contact with the first surface of the first electrode; and
- forming a second phase change pattern in contact with the second surface of the second electrode, wherein the first surface and the first phase change pattern are formed in the first contact hole and the second surface and the second phase change pattern are formed in the second contact hole,
- wherein forming the first and second electrodes includes:
- forming a lower electrode layer that fills the first and second contact holes, the lower electrode layer being formed over the substrate;
- planarizing the lower electrode layer;
- forming a first preliminary electrode filling the first contact hole;
- forming a second preliminary electrode filling the second contact hole;
- forming a sacrificial pattern on the second preliminary electrode;
- forming a recessed preliminary electrode by etching the first preliminary electrode using the sacrificial pattern as an etch mask;
- removing the sacrificial pattern; and
- etching-back the recessed preliminary electrode and the second preliminary electrode.

10. The method of claim 9, wherein the sacrificial pattern is formed of a photoresist pattern or a hard mask pattern.

11. The method of claim 9, further comprising forming a plurality of spacers on sidewalls of the first contact hole and the second contact hole.

* * * * *